(12) United States Patent
Lin

(10) Patent No.: US 9,046,546 B2
(45) Date of Patent: Jun. 2, 2015

(54) SENSOR DEVICE AND RELATED FABRICATION METHODS

(75) Inventor: Yizhen Lin, Niskayuna, NY (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 420 days.

(21) Appl. No.: 13/458,537

(22) Filed: Apr. 27, 2012

(65) Prior Publication Data

US 2013/0283912 A1 Oct. 31, 2013

(51) Int. Cl.
| | | |
|---|---|---|
| G01P 15/08 | (2006.01) | |
| G01P 15/125 | (2006.01) | |
| G01L 9/00 | (2006.01) | |
| G01L 13/02 | (2006.01) | |
| G01L 15/00 | (2006.01) | |
| G01L 19/00 | (2006.01) | |
| G01L 9/12 | (2006.01) | |

(52) U.S. Cl.
CPC ....... *G01P 15/0802* (2013.01); *Y10T 29/49826* (2015.01); *G01P 15/125* (2013.01); *G01L 9/0042* (2013.01); *G01L 9/0047* (2013.01); *G01L 9/0073* (2013.01); *G01L 13/025* (2013.01); *G01L 15/00* (2013.01); *G01L 19/0092* (2013.01); *G01L 9/125* (2013.01)

(58) Field of Classification Search
CPC . G01P 15/0802; G01P 15/125; G01L 9/0042; G01L 19/0092; G01L 9/0073; G01L 13/025; G01L 15/00; G01L 9/0047
USPC .............. 73/514.16, 717, 700, 716, 724, 708, 73/715
See application file for complete search history.

(56) References Cited

U.S. PATENT DOCUMENTS

| | | | |
|---|---|---|---|
| 5,668,033 | A | 9/1997 | Ohara et al. |
| 5,804,086 | A | 9/1998 | Bruel |
| 6,214,634 | B1 | 4/2001 | Osajda et al. |
| 6,769,319 | B2 | 8/2004 | McDonald et al. |
| 6,781,231 | B2 | 8/2004 | Minervini |
| 6,939,473 | B2 | 9/2005 | Nasiri et al. |
| 7,334,480 | B2 | 2/2008 | Silverbrook et al. |
| 7,642,115 | B2 | 1/2010 | Eriksen et al. |
| 7,674,638 | B2 | 3/2010 | Okudo et al. |
| 7,902,843 | B2 | 3/2011 | Fang et al. |
| 7,955,885 | B1 | 6/2011 | Bhugra et al. |
| 8,154,062 | B2 | 4/2012 | Park |
| 2002/0102004 | A1 | 8/2002 | Minervini |

(Continued)

OTHER PUBLICATIONS

Hooper, S., et al. "Methods for Fabricating Sensor Device Package Using a Sealing Structure," U.S. Appl. No. 13/092,001, filed Apr. 21, 2012.

(Continued)

*Primary Examiner* — Lisa Caputo
*Assistant Examiner* — Philip Cotey
(74) *Attorney, Agent, or Firm* — Ingrassia Fisher & Lorenz, P.C.

(57) ABSTRACT

Apparatus and related fabrication methods are provided for a sensor device. An exemplary sensor device includes a first structure including a first sensing arrangement and a second sensing arrangement formed therein and a second structure affixed to the first structure. The second structure includes a cavity aligned with the first sensing arrangement to provide a first reference pressure on a first side of the first sensing arrangement and an opening aligned with the second sensing arrangement to expose the first side of the second sensing arrangement to an ambient pressure.

18 Claims, 5 Drawing Sheets

(56) References Cited

U.S. PATENT DOCUMENTS

| | | |
|---|---|---|
| 2006/0213276 A1 | 9/2006 | Ueyanagi et al. |
| 2007/0013052 A1 | 1/2007 | Zhe et al. |
| 2007/0040231 A1 | 2/2007 | Harney et al. |
| 2007/0062296 A1* | 3/2007 | Silverbrook et al. ........ 73/729.2 |
| 2007/0205492 A1 | 9/2007 | Wang |
| 2007/0295456 A1 | 12/2007 | Gudeman et al. |
| 2008/0022777 A1 | 1/2008 | Tan et al. |
| 2009/0050990 A1 | 2/2009 | Aono et al. |
| 2009/0193902 A1* | 8/2009 | Silverbrook et al. ........... 73/708 |
| 2010/0052082 A1 | 3/2010 | Lee et al. |
| 2010/0155866 A1* | 6/2010 | Guo et al. ..................... 257/419 |
| 2010/0242603 A1 | 9/2010 | Miller et al. |
| 2010/0276765 A1 | 11/2010 | Yamamoto et al. |
| 2011/0126632 A1 | 6/2011 | McNeil et al. |
| 2011/0132096 A1* | 6/2011 | Ricks ............................ 73/708 |
| 2011/0165717 A1 | 7/2011 | Lee et al. |
| 2012/0042731 A1 | 2/2012 | Lin et al. |
| 2012/0043627 A1 | 2/2012 | Lin et al. |
| 2012/0266684 A1* | 10/2012 | Hooper et al. .................. 73/715 |

OTHER PUBLICATIONS

Hooper, S., et al., "Sensor Device With Sealing Structure," U.S. Appl. No. 13/091,997, filed Apr. 21, 2012.

USPTO, Final Office Action in U.S. Appl. No. 13/902,001, mailed Jan. 7, 2013.

USPTO, Response to Final Office Action dated Jan. 7, 2013, in U.S. Appl. No. 13/092,001, mailed Mar. 7, 2013.

USPTO, Notice of Allowance and Fee(s) Due, in U.S. Appl. No. 13/092,001, mailed Apr. 3, 2013.

United States Patent and Trademark Office, Office Action for U.S. Appl. No. 13/091,997, dated Jun. 8, 2012.

United States Patent and Trademark Office, Office Action for U.S. Appl. No. 13/092,001, dated Jun. 8, 2012.

USPTO "Notice of Allowance" mailed Nov. 8, 2012; U.S. Appl. No. 13/091,997, filed Apr. 21, 2011.

* cited by examiner

SENSOR DEVICE AND RELATED FABRICATION METHODS

TECHNICAL FIELD

Embodiments of the subject matter described herein relate generally to sensing devices and applications, and more particularly, embodiments of the subject matter relate to sensor devices with multiple sensing arrangements and multiple sealed chambers.

BACKGROUND

Microelectromechanical systems (MEMS) are widely used in a variety of sensing applications. For example, a MEMS pressure sensor may be implemented on a semiconductor die to generate electrical signals indicative of the amount of pressure exerted on the semiconductor die (or a portion thereof), or a MEMS accelerometer may generate electrical signals indicative of the rate and/or direction of acceleration of the semiconductor die. In some applications, the use of multiple different MEMS sensors to measure different properties may be desirable. For example, in an automotive application, a MEMS pressure sensor may be utilized to measure tire pressure while a MEMS accelerometer may be utilized to measure the vehicle acceleration.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
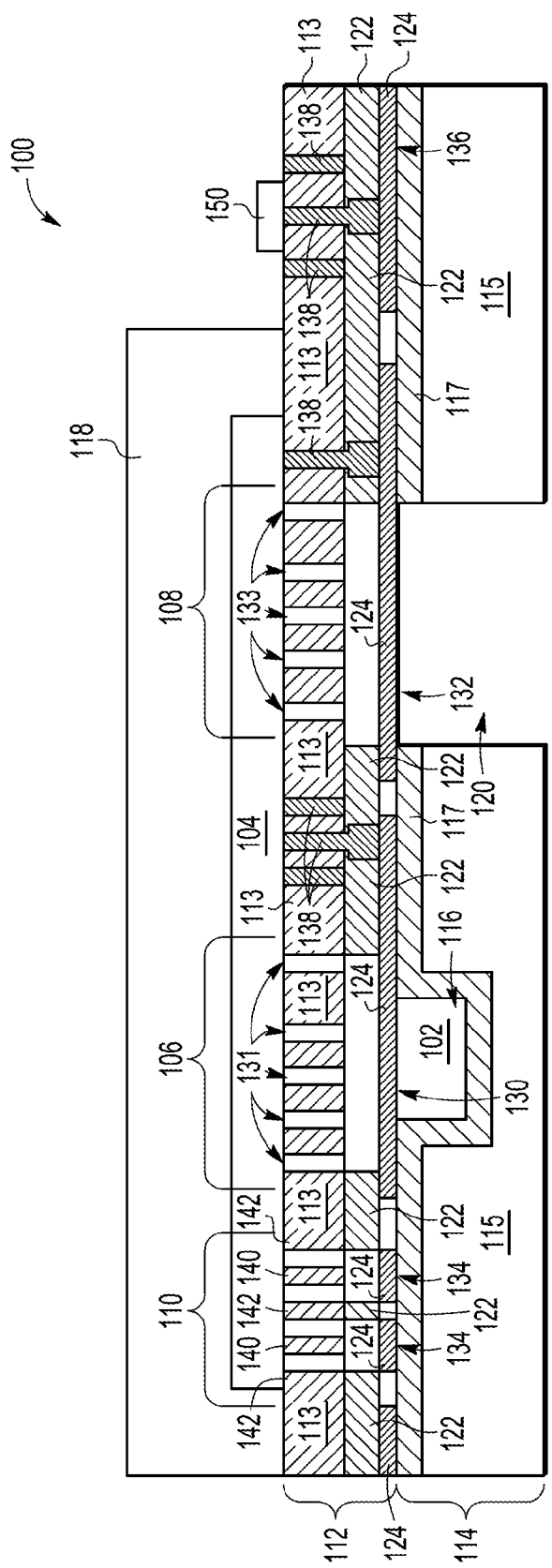
FIG. 1 is a cross-sectional view of a sensor device in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

It is desirable to provide integrated MEMS sensor devices that include multiple different sensing arrangements packaged in a manner that provides protection and helps ensure relatively high reliability over the lifetime of the device. Accordingly, embodiments of the subject matter described herein relate to sensor devices that include different types of sensing arrangements and provide multiple different reference pressures for the different sensing arrangements and packaged in a way that mitigates the effects of package stress on pressure sensing. As described in greater detail below, in an exemplary embodiment, a sensor structure that includes multiple sensing arrangements formed therein is affixed to a base structure that includes a cavity aligned with a diaphragm region of a pressure sensing arrangement in the sensor structure to provide a sealed chamber having a reference pressure when the sensor structure is affixed to the base structure. Additionally, an opening formed in the base structure is aligned with a diaphragm region of a second pressure sensing arrangement to expose the diaphragm region of the second pressure sensing arrangement to an ambient pressure. A capping structure is affixed to the opposing side of the sensor structure to provide a sealed chamber having a second reference pressure that encompasses the sensing arrangements formed in the sensor structure. In this regard, the top sides of the diaphragm regions are both exposed to the second reference pressure, while the back side of the diaphragm region of the second pressure sensing arrangement is exposed to the ambient pressure and the back side of the diaphragm region of the first pressure sensing arrangement is exposed to the reference pressure provided by the cavity. In this manner, deflection of both of the diaphragm regions is influenced by the second reference pressure, such that the relationship between output signals from the pressure sensing arrangements may be utilized to effectively cancel out any changes to the second reference pressure due to temperature changes or other external factors or any deflection or deformation of the diaphragm regions and/or overlying electrode regions caused by package stress and provide an accurate measurement of the ambient pressure. Thus, the sensor device may be overmolded or otherwise packaged in a manner that protects the sensor device from potentially harsh operating environments without impairing ability of the sensor device to accurately sense the ambient pressure. In an exemplary embodiment, the sensor structure and the base structure are affixed to one another at vacuum, so that the cavity provides a vacuum reference pressure for the first pressure sensing arrangement, while the capping structure is affixed to the sensor structure at a different pressure that is chosen based on the needs of the other sensing arrangement(s) formed in the sensor structure. In this regard, if the sensor structure includes an inertial sensor, such as an accelerometer, that achieves improved performance at a particular pressure (or a range thereof), the capping structure is affixed to the sensor structure at a pressure that corresponds to (or is approximately equal to) the desired pressure that improves performance of the inertial sensor. For example, in one embodiment, the capping structure is affixed to the sensor structure at partial (or low) vacuum (e.g., 100 torr or more), so that an accelerometer formed in the sensor structure may operate at partial vacuum.

FIG. 1 depicts an exemplary embodiment of a sensor device 100 that includes a plurality of sealed chambers 102, 104 and a plurality of sensing arrangements 106, 108, 110. As described in greater detail below, in an exemplary embodiment, the sensor device is realized as an integrated microelectromechanical system (MEMS) pressure sensor that includes a pair of pressure sensing arrangements 106, 108 along with at least one additional sensing arrangement 110 formed on a sensor structure 112 that is affixed to a base structure 114 having a cavity 116 (or void) formed therein to establish a first sealed chamber 102 having a fixed or substantially constant (e.g., neglecting variations due to temperature and the like) pressure, such as vacuum or another substantially low pressure (e.g., 1 millitorr or less). In accordance with one embodiment, the third sensing arrangement 110 is realized as inertial sensor, such as an accelerometer or a gyroscope. A capping structure 118 is bonded to the side of the sensor structure 112 that is opposite the base structure 114 to establish a second sealed chamber 104 having a second pressure that that encompasses, surrounds, or otherwise encloses the top side of the sensing arrangements 106, 108, 110. In exemplary embodiments, the pressure of the first sealed chamber 102 is different from the pressure of the second sealed chamber 104 to provide two different reference pressures (or pressure references) for the sensing arrangements 106, 108, 110, as described in greater detail below.

In an exemplary embodiment, the base structure 114 is realized as substrate (or die) of a semiconductor material 115, such as a monocrystalline silicon material. As described in greater detail below in the context of FIG. 3, prior to bonding the base structure 114 to the sensor structure 112, the upper surface of the semiconductor material 115 is etched in a conventional manner to form the cavity 116 having a depth that is less than the thickness of the base structure 114 while leaving the surrounding portions of the semiconductor material 115 intact. In accordance with one or more embodiments, the depth of the cavity 116 is between about 50 to about 200 microns (or micrometers). After affixing the base structure 114 to the sensor structure 112, the bottom surface of the base structure 114 is etched to form an opening 120 (or hole) that extends through the base structure 114 and is centered with respect to or otherwise aligned with the diaphragm region 132 of a pressure sensing arrangement 108 formed in the sensor structure 112. In this regard, the opening 120 provides a pressure vent that exposes the diaphragm region 132 to ambient pressure surrounding the sensor device 100 that enters the opening 120 and interfaces with the diaphragm region 132 to deflect the diaphragm region 132, as described in greater detail below. For convenience, the surface of the base structure 114 and/or sensor device 100 that is etched to form the opening 120 may alternatively be referred to herein as the backside surface (or backside) of the sensor device 100 and the opposing side of the base structure 114 and/or the sensor device 100 may alternatively be referred to herein as the topside surface (or topside).

In exemplary embodiments, the sensor structure 112 is also realized as a substrate (or die) of a semiconductor material 113, such as a monocrystalline silicon material. As described in greater detail below in the context of FIGS. 3-8, a layer of a dielectric material 122, such as silicon dioxide or another oxide material, is formed on a surface of the semiconductor material 113, for example, by chemical vapor deposition (CVD) or another suitable deposition process, and a layer of a conductive material 124, such as a polysilicon material, is formed on a surface of the dielectric material 122. The conductive material 124 is patterned to provide diaphragm regions 130, 132 for the pressure sensing arrangements 106, 108 along with electrode regions 134 for the sensing arrangement 110 and conductive traces 136 for providing electrical connections and routing electrical signals from/to the sensing arrangements 106, 108, 110. After the sensor structure 112 is bonded to the base structure 114, portions of the semiconductor material 113 and the dielectric material 122 are removed to form the sensing arrangements 106, 108, 110. As described below, portions of the semiconductor material 113 and the dielectric material 122 overlying the pressure sensing arrangements 106, 108 are removed to provide suspended frame-like structures of the semiconductor material 113 that include openings 131, 133 that are substantially aligned with or otherwise overlie the diaphragm regions 130, 132 that expose the topside of the diaphragm regions 130, 132 to the second reference pressure provided by the second sealed chamber 104. The remaining portions of semiconductor material 113 overlying the diaphragm regions 130, 132 function as electrode regions for the respective pressure sensing arrangements 106, 108, as described in greater detail below.

In the illustrated embodiment of FIG. 1, portions of the semiconductor material 113 and the dielectric material 122 overlying the electrode regions 134 are also removed to provide suspended portions 140 of the semiconductor material 113 overlying the electrode regions 134 that are movable with respect to fixed portions 142 of the semiconductor material 113, as described in greater detail below. For example, in an exemplary embodiment, the third sensing arrangement 110 may be realized as an accelerometer comprised of proof mass portions 140 that are suspended above the electrode regions 134 between fixed portions 142 of the semiconductor material 113 by a spring or the like, wherein displacement of the proof mass portions 140 relative to the fixed portions 142 produces a corresponding change in the capacitances between the proof mass portions 140 and the electrode regions 134 and/or fixed portions 142 which corresponds to the rate and/or amount of acceleration exhibited by the sensor device 100. Additionally, in the illustrated embodiment, portions of the semiconductor material 113 and/or the dielectric material 122 are removed and filled with a conductive material to provide conductive interconnects 138 (or vias). In an exemplary embodiment, the topside surface of sensor structure 112 that is not encompassed by the capping structure 118 includes one or more conductive bonding pads 150 (or contact pads) formed overlying corresponding vias 138 that function as input/output terminals for providing and/or receiving electrical signals to/from the sensing arrangements 106, 108, 110 and/or other devices or components external to the sensing device 100, such as, for example, control circuitry formed on a separate substrate (or die) of semiconductor material, as described in greater detail below in the context of FIG. 2.

Still referring to FIG. 1, after fabrication of the sensor structure 112 is completed, the capping structure 118 is affixed to the topside of the sensor structure 112 to provide the second sealed chamber 104 that encompasses, surrounds, or otherwise encloses the top side of the sensing arrangements 106, 108, 110. In exemplary embodiments, the capping structure 118 is affixed to the sensor structure 112 at a pressure chosen to provide an operating pressure that improves performance of the third sensing arrangement 110, that is, a desired reference pressure for the third sensing arrangement 110. For example, in accordance with one embodiment, the third sensing arrangement 110 is realized as an accelerometer having an desired reference pressure corresponding to a partial (or low) vacuum pressure of about 100 torr (or about 13.3 kilopascals) or more, wherein the capping structure 118 is affixed to the sensor structure 112 at a partial vacuum pressure (e.g., 100 torr or more) to provide the second sealed chamber 104 having a partial vacuum reference pressure corresponding to the desired reference pressure for the accelerometer. In an exemplary embodiment, the capping structure 118 is formed by etching a substrate (or die) of semiconductor material to provide a cavity configured to encompass the sensing arrangements 106, 108, 110, that is, a cavity corresponding to the chamber 104. In other embodiments, the capping structure 118 may be realized as a glass or ceramic lid structure. The capping structure 118 is affixed to the sensor structure 112, for example, by eutectic bonding or using solder or glass frit to form a hermetically sealed (or airtight) chamber 104 at the second pressure (e.g., partial vacuum).

As described above, the first diaphragm region 130 of the first pressure sensing arrangement 106 is aligned with the cavity 116 formed in the base structure 114, such that the sealed chamber 102 is adjacent to and interfaces with the backside of the first diaphragm region 130 and provides a reference pressure for the first pressure sensing arrangement 106. In this regard, in exemplary embodiments, the sensor structure 112 and the base structure 114 are bonded at vacuum, such that the sealed chamber 102 provides a vacuum reference pressure for the first pressure sensing arrangement 106. The openings 131 (or holes) aligned with the diaphragm region 130 to allow the pressure of the second sealed chamber 104 to interface with the top side of the first diaphragm region 130, such that the diaphragm region 130 deflects or otherwise moves relative to the overlying electrode regions of semiconductor material 113 in response to a difference between the reference pressure provided by the first sealed chamber 102 and the second pressure provided by the second sealed chamber 104. In this manner, the vacuum reference pressure provided by the first sealed chamber 102 to the backside of the first diaphragm region 130 may be used as a reference pressure when measuring the second pressure applied to the topside of the diaphragm region 130 by the second sealed chamber 104. In an exemplary embodiment, the pressure sensing arrangement 106 is realized as a capacitive pressure sensor that produces electrical signals indicative of the capacitance between the overlying semiconductor material 113 and the diaphragm region 130 of conductive material 124, which is influenced by the amount of displacement or deflection of the diaphragm region 130, and thus, are indicative of the amount of pressure exerted on the diaphragm region 130 by the second sealed chamber 104 relative to the reference pressure provided by the first sealed chamber 102. For example, an input electrical signal (e.g., a voltage and/or current) may be applied to the pressure sensing arrangement 106 and the response signal that is influenced by the capacitance of the pressure sensing arrangement 106 (e.g., the resulting voltage across and/or current through the pressure sensing arrangement 106) may be provided as an output electrical signal indicative of the pressure of the second sealed chamber 104 relative to the pressure of the first sealed chamber 102 to external control circuitry. In this regard, package stress or other external forces may cause the diaphragm region 130 to deflect toward and/or away from the semiconductor material 113 by a corresponding amount, thereby changing the capacitance between the semiconductor material 113 and the diaphragm region 130 to indicate the second reference pressure.

Still referring to FIG. 1, in an exemplary embodiment, the second pressure sensing arrangement 108 is formed in the sensor structure 112 proximate to the first pressure sensing arrangement 106. As described above, the opening 120 in the base structure 114 is aligned with the diaphragm region 132 of the second pressure sensing arrangement 108 such that an ambient pressure interfaces with the backside of the diaphragm region 132, while the openings 133 aligned with the diaphragm region 132 allow the second pressure provided by the second sealed chamber 104 to interface with the topside of the second diaphragm region 132 and provide a reference pressure for the second pressure sensing arrangement 108. In this regard, the second diaphragm region 132 deflects in response to a difference between the ambient pressure interfacing with the backside of the second diaphragm region 132 via the opening 120 and the second reference pressure of the second sealed chamber 104. The second pressure sensing arrangement 108 is also realized as a capacitive pressure sensor that produces electrical signals indicative of the capacitance between the overlying semiconductor material 113 and the diaphragm region 132, which is influenced by the amount of displacement or deflection of the diaphragm region 132, and thus, indicates the amount of ambient pressure exerted on the diaphragm region 132 relative to the reference pressure provided by the second sealed chamber 104. As described in greater detail below, in an exemplary embodiment, the ambient pressure is determined based on the capacitance of (or electrical output signals from) the second pressure sensing arrangement 108 relative to the capacitance of (or electrical output signals from) the first pressure sensing arrangement 106. For example, a first pressure metric obtained from the second pressure sensing arrangement 108 indicative of the ambient pressure relative to the partial vacuum pressure of the second sealed chamber 104 may be added to a second pressure metric obtained from the first pressure sensing arrangement 106 indicative of the partial pressure of the second sealed chamber 104 relative to the vacuum pressure of the first sealed chamber 102 to obtain a pressure metric indicative of the ambient pressure relative to a vacuum reference pressure (e.g., the pressure of the first sealed chamber 102). In this regard, changes to the reference pressure of the second sealed chamber 104 due to temperature or other external factors are effectively cancelled out and do not impact the accuracy of the measurement of the ambient pressure. Additionally, any deflection or deformation of the diaphragm regions 130, 132 and/or the overlying electrode regions of semiconductor material 113 caused by package stress or other external forces are effectively cancelled out as well, and thus, the impact of package stress on the accuracy of the measurement of the ambient pressure is mitigated or otherwise reduced.

It should be understood that FIG. 1 is a simplified representation of the sensor device for purposes of explanation, and practical embodiments of the sensor device may include any number of additional or alternative components, and the subject matter described herein is not intended to be limited to any particular sensor configuration. For example, although the pressure sensing arrangements 106, 108 may be described herein in the context of capacitive pressure sensing arrangements, in alternative embodiments, one or more of the pressure sensing arrangements 106, 108 may be realized as piezoresistive pressure sensors comprised of piezoresistive elements fabricated on a respective diaphragm region 130, 132. Accordingly, practical embodiments of one or more of the sensing arrangement 106, 108, 110 may include any number of layers of semiconductive, conductive, and/or dielectric materials that are fabricated in a desired manner to achieve a desired sensing capability.

Figure 2:
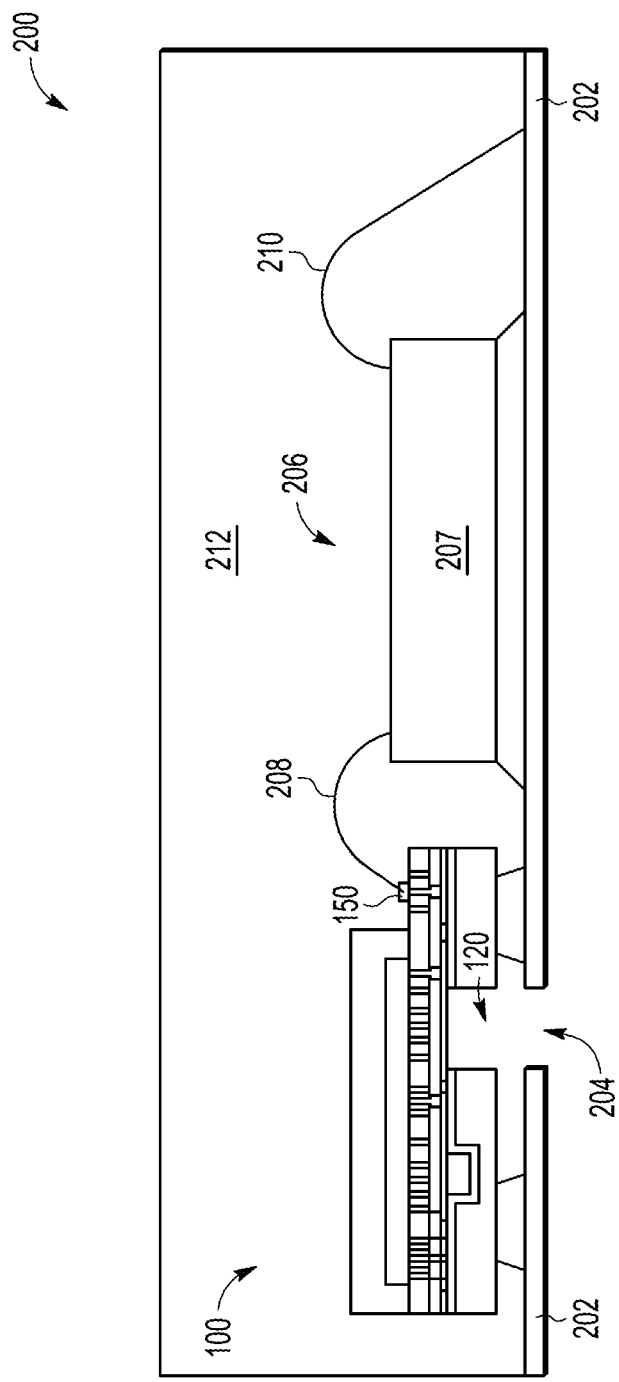
FIG. 2 is a cross-sectional view of an exemplary sensor device package suitable for use with the sensor device of FIG. 1 in accordance with one embodiment of the invention.

FIG. 2 depicts an exemplary embodiment of a sensor device package 200 for packaging the sensor device 100 of FIG. 1. After fabricating the sensing device 100, fabrication of the sensor device package 200 continues by affixing, bonding, or otherwise mounting the backside surface of the sensor device 100 and/or base structure 114 to a package substrate structure 202, for example, by using an epoxy or silicone adhesive to adhere them together. The package substrate structure 202 includes an opening 204 (or hole) formed therein, and the sensor device 100 is positioned on the package substrate structure 202 such that the opening 204 is centered or otherwise aligned with the opening 120 in the base structure 114 to provide a pressure vent that allows ambient pressure surrounding the sensor device package 200 to enter the opening 120 and interface with the backside of the diaphragm region 132, as described above. In this regard, at least a portion of the opening 204 overlaps the opening 120. In accordance with one embodiment, the package substrate structure 202 is realized as a lead frame structure. In other embodiments, the package substrate structure 202 may be realized as a circuit board or another suitable electronics substrate including conductive traces and/or other electrical interconnections, solder balls, or the like to provide a desired mounting configuration and a desired electrical connectivity to/from the devices 100, 206 of the sensor device package 200 and other external devices and/or systems.

In an exemplary embodiment, the sensor device package 200 includes a control device 206 that is affixed, bonded, or otherwise mounted to the package substrate structure 202 and communicatively coupled to the sensor device 100. In accordance with one or more embodiments, the control device 206 is realized as an application specific integrated circuit (ASIC) consisting of control circuitry formed on another semiconductor substrate 207 (or die). For convenience, the control device 206 may alternatively be referred to herein as an ASIC and the semiconductor substrate 207 may alternatively be referred to herein as an ASIC die. The ASIC 206 may include one or more processors (or microprocessors), one or more controllers (or microcontrollers), and/or other hardware, processing logic, circuitry or components formed on the ASIC die 207. The topside surface of the ASIC die 207 includes conductive bonding pads (or contact pads) that function as input/output terminals for providing and/or receiving electrical signals to/from the sensing arrangements 106, 108, 110 of the sensor device 100. As illustrated, a conductive wire bond 208 is formed between the bonding pad(s) 150 on the topside surface of the sensor structure 112 and the bonding pad(s) on the topside surface of the ASIC die 207 to provide electrical connections between the sensing arrangements 106, 108, 110 and the control circuitry. In this manner, the ASIC 206 communicates with the sensor device 100 to obtain the electrical output signals from the pressure sensing arrangements 106, 108 determine the magnitude of the ambient pressure that is applied to the diaphragm region 132 and obtain electrical output signals from the inertial sensing arrangement 110 indicative of the acceleration of the sensor device 100 and/or the sensor device package 200. For example, as described above, the control circuitry is configured to convert the output electrical signals from the pressure sensing arrangements 106, 108 to a corresponding pressure metric indicative of the ambient pressure based on the relationship between the capacitance of the second pressure sensing arrangement 108 and the capacitance of the first pressure sensing arrangement 106. A second conductive wire bond 210 is formed between a bonding pad on the topside surface of the ASIC die 207 and the package substrate structure 202 to establish an electrical connection between the ASIC 206 and external circuitry and/or components for outputting the pressure metric determined based on the relative capacitances of the pressure sensing arrangements 106, 108 and/or the acceleration metrics determined based on the electrical signals from the inertial sensing arrangement 110.

In an exemplary embodiment, after affixing the devices 100, 206 to the package substrate structure 202 and forming the wire bonds 208, 210 between the devices 100, 206 and the package substrate structure 202, fabrication of the sensor device package 200 continues by forming a molding compound 212, such as a thermosetting epoxy molding compound, overlying the devices 100, 206 (e.g., by transfer molding) to encapsulate the devices 100, 206 and the wire bonds 208, 210. In this regard, the molding compound 212 fills any spaces between the devices 100, 206 and protects the circuitry and/or components of the devices 100, 206 from environmental elements. As described above, by virtue of the sensor device 100 including two pressure sensing arrangements 106, 108 utilized to determine the ambient pressure relative to a vacuum reference pressure in a differential manner (e.g., based on the relationship between the outputs of the pressure sensing arrangements 106, 108), any external forces applied to the sensor device 100 by the molding compound 212 (e.g., due to thermal expansion or the like) that may cause deflection or deformation of the diaphragm regions 130, 132 and/or the overlying electrode regions of semiconductor material 113 do not impair the ability of the sensor device 100 to accurately measure the ambient pressure.

The pressure sensor device package 200 of FIG. 2 may be mounted to a circuit board or another electronics substrate to interface with other electrical components and/or systems, as will be appreciated in the art. In this regard, the circuit board (or electronics substrate) having the sensor device package 200 mounted thereto preferably includes a corresponding opening or pressure vent that is substantially aligned with the opening 204 in the package substrate structure 202 or otherwise configured to allow the ambient pressure surrounding the sensor device package 200 to enter the opening 120 to deflect or otherwise influence the second diaphragm region 132 of the second pressure sensing arrangement 108. It should be noted that the sensor device package 200 of FIG. 2 is merely one exemplary manner for packaging the sensor device 100 for purposes of explanation, and is not intended to limit the subject matter in any way. For example, in practice, the sensor device 100 may be packaged by affixing the sensor device 100 to the ASIC 206 in a stacked configuration and forming the molding compound 212 encapsulating the stacked arrangement.

Figure 3:
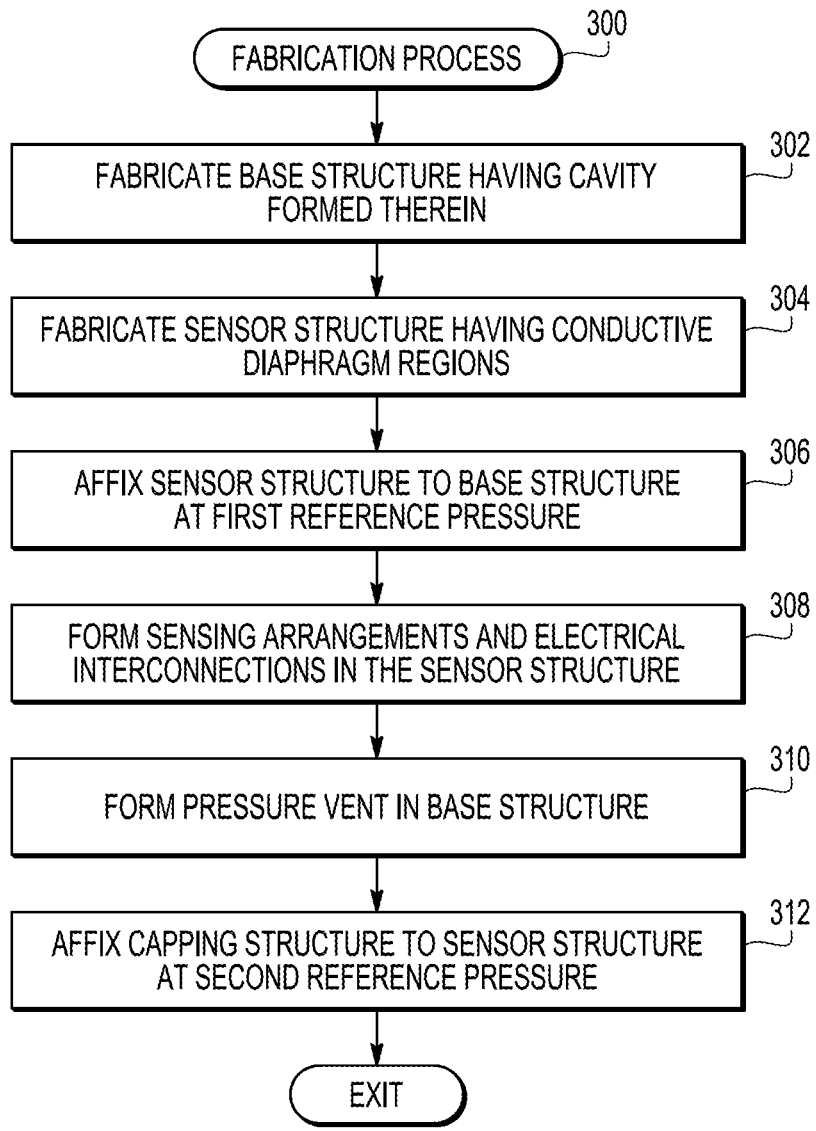
FIG. 3 is a flow diagram illustrating an exemplary fabrication process suitable for fabricating the sensor device of FIG. 1 in accordance with one embodiment of the invention.

FIG. 3 illustrates an exemplary fabrication process 300 for forming the sensor device 100 of FIG. 1 and FIGS. 4-8 illustrate cross-sectional views of fabrication of the sensor device 100 in accordance with the fabrication process 300. It should be understood that although the subject matter may be described herein in the context of the sensor structure 112 and base structure 114 as being fabricated and/or affixed together in die form, in practical embodiments, sensor devices may be formed using wafers that are affixed and subsequently diced to obtain the sensor device 100. It should be appreciated that the fabrication process 300 may include any number of additional or alternative tasks, the tasks need not be performed in the illustrated order and/or the tasks may be performed concurrently.

Figure 4:
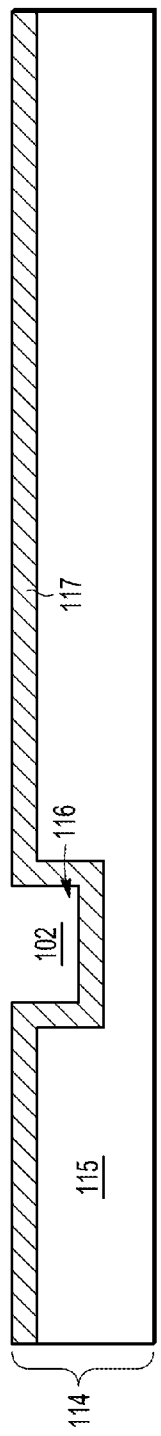
FIGS. 4-8 are cross-sectional views illustrating fabrication of the sensor device of FIG. 1 in conjunction with the fabrication process of FIG. 3 in accordance with one embodiment of the invention.

Referring to FIGS. 3-4, in an exemplary embodiment, the fabrication process 300 begins by fabricating a base structure having a cavity (or void) formed therein (task 302). The cavity 116 may be formed, for example, by performing photolithography to expose a portion of a substrate (or wafer) of semiconductor material 115 while masking surrounding portions of the semiconductor material 115 and etching the exposed portion of semiconductor material 115 (e.g., using reactive ion etching or the like) to a depth that is less than the thickness of the semiconductor material 115 to form the cavity 116 while leaving the surrounding portions of the semiconductor material 115 intact. In an exemplary embodiment, after forming the cavity 116, layers of a dielectric material 117, such as silicon dioxide or another oxide material, are formed on the topside surface of the semiconductor material 115, for example, by thermal oxidation, CVD, or another suitable deposition process.

Figure 5:
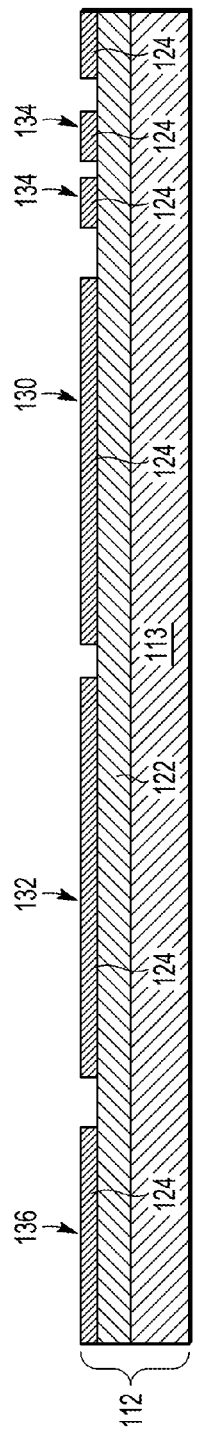

Referring to FIG. 5, the fabrication process 300 also involves fabricating a sensor structure that includes regions of an isolated layer of a conductive material for providing the diaphragm regions of pressure sensing arrangements subsequently formed in the sensor structure (task 304). In an exemplary embodiment, the sensor structure 112 is fabricated by forming the layer of dielectric material 122, such as silicon dioxide or another oxide material, overlying the substrate (or wafer) of semiconductor material 113, for example, by performing thermal oxidation or a deposition process. After forming the dielectric material 122, fabrication of the sensor structure 112 continues by forming the layer of conductive material 124, such as a polysilicon material, overlying the dielectric material 122, for example, by CVD or another suitable deposition process. In accordance with one or more embodiments, chemical-mechanical planarization (CMP) or another polishing process is performed after depositing the conductive material 124 to provide a uniform thickness for the conductive material 124 across the sensor substrate. In an exemplary embodiment, the thickness of the conductive material 124 is about 2 microns. After forming the conductive material 124, photolithography is performed to pattern and etch the conductive material 124 to form diaphragm regions 130, 132 for the subsequently formed pressure sensing arrangements 106, 108 along with electrode regions 134 for the inertial sensing arrangement 110 and conductive traces 136 for providing electrical connections from/to the sensing arrangements 106, 108, 110 to/from external elements, such as the ASIC 206.

Figure 6:
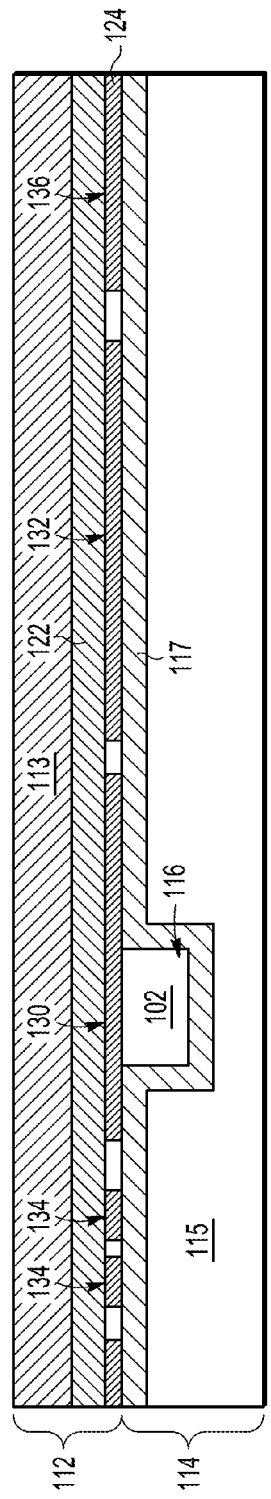
Figure 7:
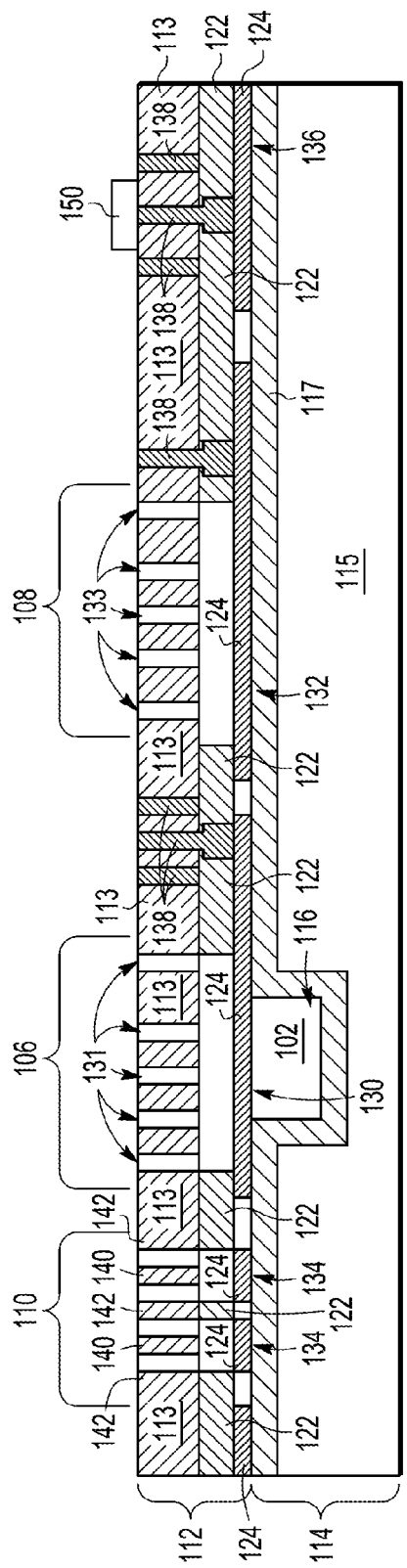

Referring now to FIG. 6, after fabricating the sensor and base structures, the fabrication process 300 continues by affixing, bonding, or otherwise joining the sensor structure to the base structure at a first reference pressure (task 306). In an exemplary embodiment, the conductive material 124 of the sensor structure 112 is bonded to the dielectric material 117 of the base structure 114 by performing wafer fusion bonding, such as silicon direct bonding, in a vacuum chamber. In this manner, the sensor structure 112 and the base structure 114 are bonded to provide a hermetically sealed (or airtight) chamber 102 at vacuum pressure. In some embodiments, after the structures 112, 114 are joined, one or more subsequent fabrication process steps are performed to reduce the thickness of the layer of semiconductor material 113 (e.g., chemical-mechanical planarization or the like). Referring now to FIG. 7, in an exemplary embodiment, the fabrication process 300 continues by forming a pressure vent in the base structure that is aligned with the diaphragm region of a pressure sensing arrangement in the sensor structure (task 308). In this regard, the opening 120 in the base structure 114 is formed by performing photolithography to expose the portions of the semiconductor material 115 and dielectric material 117 that are aligned with the diaphragm region 132 of the second pressure sensing arrangement 108 while masking surrounding portions of the semiconductor material 115 and etching the exposed portions of semiconductor material 115 and the dielectric material 117 until the conductive material 124 of the second diaphragm region 132 is exposed. It should be noted that in alternative embodiments, the pressure vent may be formed in the base structure after forming sensing arrangements and electrical interconnections in the sensor structure (e.g., task 310) or after affixing the capping structure to the sensor structure (e.g., task 312), as described in greater detail below.

Figure 8:
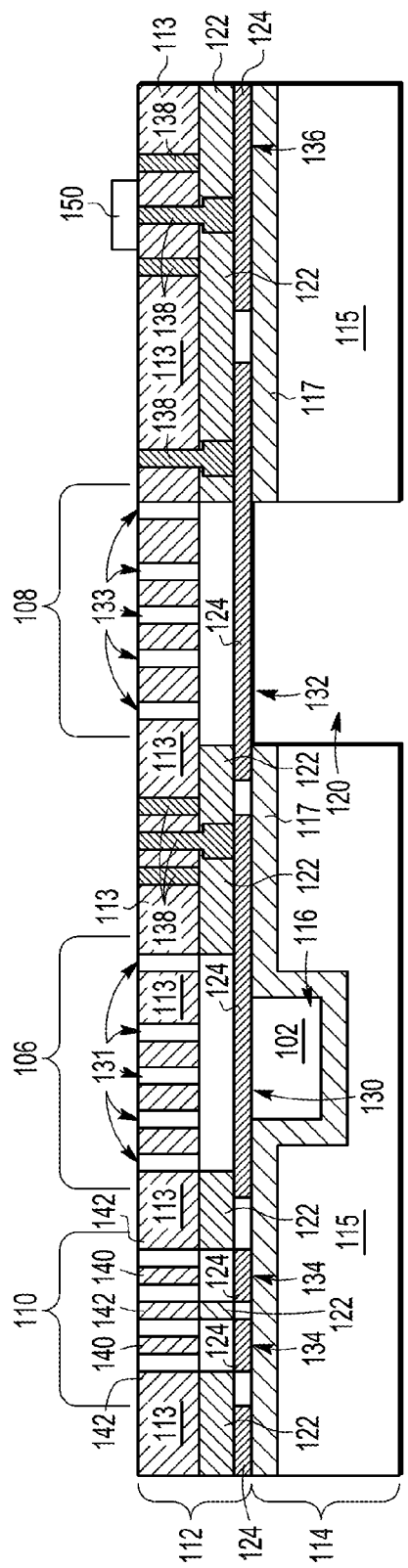

Referring to FIG. 8, after affixing the sensor and base structures, the fabrication process 300 continues by forming sensing arrangements and electrical interconnections in the sensor structure (task 310). In an exemplary embodiment, the semiconductor material 113 is patterned and etch, for example, using photolithography and reactive ion etching, to form a plurality of openings (or voids) that extend through the semiconductor material 113 to expose the dielectric material 122. After forming openings in the semiconductor material 113, portions of the dielectric material 122 overlying the diaphragm regions 130, 132 and portions of the dielectric material 122 underneath the proof mass regions 140 are removed, for example, by performing additional patterning and etching process steps. In this regard, the openings 131, 133 formed overlying the diaphragm regions 130, 132 function as pressure vents that expose the diaphragm regions 130, 132 to the reference pressure of the subsequently formed chamber 104, while the openings formed for the inertial sensing arrangement 110 separate the proof mass regions 140 from the fixed portions 142 of the semiconductor material 113 to allow the proof mass regions 140 to be displaced relative to the fixed portions 142. In an exemplary embodiment, openings in the semiconductor material 113 and/or the dielectric material 122 for conductive interconnects 138 may be concurrently formed while forming the sensing arrangements 106, 108, 110. In this regard, after forming the openings for the conductive interconnects 138, fabrication of the sensor device 100 continues by forming a conductive material in the openings to provide conductive interconnects 138 (or vias) to/from the conductive traces 136, the diaphragm regions 130, 132, and/or the electrode regions 134. In the illustrated embodiment, after forming the conductive interconnects 138 in the sensor structure 112, one or more bonding pads 150 (or contact pads) are formed on the topside of the semiconductor material 113 to provide input/output terminals for providing and/or receiving electrical signals to/from the sensing arrangements 106, 108, 110 and/or other devices or components external to the sensor device 100 (e.g., ASIC 206).

Referring to FIGS. 1-3 and 8, in an exemplary embodiment, fabrication of the sensor device is completed by affixing, bonding, or otherwise joining the capping structure to the sensor structure at a second reference pressure (task 312). In an exemplary embodiment, the capping structure 118 is bonded to the semiconductor material 113 of the sensor structure 112 using glass frit or eutectic bonding at a partial vacuum pressure to form a hermetically sealed chamber 104 having partial vacuum pressure that encompasses the topside of the sensing arrangements 106, 108, 110 so that the inertial sensing arrangement 110 operates at partial vacuum while the topside of the diaphragm regions 130, 132 are exposed to a partial vacuum reference pressure. In embodiments where the sensor device 100 is fabricated and/or affixed together in wafer form (e.g., by bonding a wafer having multiple instances of the capping structure 118 to wafers having multiple instances of the sensing arrangements 106, 108, 110, cavity 116, and opening 120), the fabrication process 300 continues by dicing (or singulating) the wafers to provide multiple instances of the sensor device 100 depicted in FIG. 1. As described above in the context of FIG. 2, after the fabrication process 300 is completed, fabrication of the sensor device package 200 may be achieved by affixing, bonding, or otherwise mounting the sensor device 100 to the package substrate structure 202, affixing, bonding, or otherwise mounting the control device 206 to the package substrate structure 202, providing electrical interconnections to/from the sensor device 100 and the control device 206 (e.g., wire bonds 208, 210), and forming a molding compound 212 that overlies and encapsulates the devices 100, 206.

As described above, one advantage of the sensor device 100 and/or the sensor device package 200 is that the ambient pressure may be measured in a manner that mitigates external forces on the sensor device 100, thereby allowing the sensor device 100 to be overmolded to provide protection from harsh operating environments. In this regard, by virtue of the pressure sensing arrangements sharing a common reference pressure or chamber (e.g., chamber 104), pressure variations or other deflections or deformations attributable to temperature changes, package stress, or other external factors are effectively canceled out to provide an accurate measurement of the ambient pressure, as described above. Additionally, an inertial sensing arrangement may be provided in the same device and/or device package and allowed to operate at a pressure that is different from the vacuum reference pressure used for determining the ambient pressure, thereby improving the performance of the inertial sensing arrangement.

For the sake of brevity, conventional techniques related to MEMS devices, pressure sensing, inertial sensing, capacitive pressure sensors and/or related calibration methods, MEMS accelerometers and/or gyroscopes, semiconductor and/or integrated circuit fabrication, device packaging, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

In one exemplary embodiment, an apparatus of a sensor device is provided. The sensor device comprises a first structure including a first sensing arrangement and a second sensing arrangement formed therein and a second structure affixed to the first structure. The second structure includes a cavity aligned with the first sensing arrangement to provide a first reference pressure on a first side of the first sensing arrangement and an opening aligned with the second sensing arrangement to expose the first side of the second sensing arrangement to an ambient pressure. In one embodiment, the sensor device further comprises a third structure coupled to a second side of the first structure to provide a second reference pressure on the second side of the first sensing arrangement and the second side of the second sensing arrangement, wherein the first reference pressure and the second reference pressure are different. In a further embodiment, the third structure provides a sealed chamber adjacent to the second side of the first sensing arrangement and the second side of the second sensing arrangement, and the sealed chamber has the second reference pressure. In yet another embodiment, the first sensing arrangement includes a first diaphragm region to deflect in response to a difference between the first reference pressure and the second reference pressure, and the second sensing arrangement includes a second diaphragm region to deflect in response to a difference between the ambient pressure and the second reference pressure. In another embodiment, the sensor device further comprises a third sensing arrangement formed in the first structure, wherein the third structure provides a sealed chamber adjacent to the second side of the first sensing arrangement, the second side of the second sensing arrangement, and the second side of the third sensing arrangement, and the sealed chamber is at the second reference pressure. In accordance with one embodiment, the sensor device further comprises a molding compound encapsulating the third structure. In another embodiment, the sensor device further comprises a third sensing arrangement formed in the first structure, and in one or more embodiments, the third sensing arrangement comprises an inertial sensing arrangement. In accordance with yet another embodiment, the first sensing arrangement comprises a first pressure sensing arrangement and the second sensing arrangement comprises a second pressure sensing arrangement, and in one or more embodiments, the first reference pressure is at vacuum a second reference pressure on a second side of the first sensing arrangement and the second side of the second sensing arrangement is at partial vacuum. In another embodiment, the first sensing arrangement comprises a first pressure sensing arrangement and the second sensing arrangement comprises a second pressure sensing arrangement. In one or more embodiments, the first pressure sensing arrangement includes a first diaphragm region and the second pressure sensing arrangement includes a second diaphragm region, wherein deflection of the first diaphragm region is influenced by the first reference pressure and deflection of the second diaphragm region is influenced by the ambient pressure and is independent of the first reference pressure. In a further embodiment, the sensor device further comprises control circuitry to determine a pressure metric indicative of the ambient pressure based on a relationship between a first electrical signal from the first sensing arrangement and a second electrical signal from the second sensing arrangement, wherein the first electrical signal is influenced by the deflection of the first diaphragm region and the second electrical signal is influenced by the deflection of the second diaphragm region.

In accordance with another embodiment, a sensor device is provided that comprises a first sensing arrangement including a first diaphragm region, a second sensing arrangement including a second diaphragm region exposed to an ambient pressure, a first sealed chamber adjacent to a first side of the first sensing arrangement and having a first reference pressure, and a second sealed chamber adjacent to a second side of the first sensing arrangement and the second side of the second sensing arrangement that has a second reference pressure different from the first reference pressure, wherein first diaphragm region deflects in response to a difference between the first reference pressure and the second reference pressure and the second diaphragm region deflects in response to a difference between the ambient pressure and the second reference pressure. In one embodiment, the sensor device further comprises an integrated circuit die having control circuitry formed thereon, wherein the control circuitry is coupled to the sensor device to determine a pressure metric indicative of the ambient pressure based on a relationship between a first electrical signal from the first sensing arrangement and a second electrical signal from the second sensing arrangement, the first electrical signal is influenced by the deflection of the first diaphragm region, and the second electrical signal is influenced by the deflection of the second diaphragm region. In a further embodiment, the sensor device includes a package substrate structure having the sensor device and the integrated circuit die affixed thereto, wherein the package substrate structure includes an opening aligned with the second sensing arrangement to expose the second diaphragm region to the ambient pressure. In another embodiment, the sensor device includes an inertial sensing arrangement and a substrate of semiconductor material having the first sensing arrangement, the second sensing arrangement, and the inertial sensing arrangement formed therein, wherein the second sealed chamber encompasses a side of the inertial sensing arrangement.

In accordance with another embodiment, a method of fabricating a sensor device is provided. The method involves forming a first structure having a cavity, affixing the first structure to a first side of a second structure at a first pressure so that the cavity provides a first sealed chamber at the first pressure adjacent to the first side of a first sensing arrangement of the second structure in response to affixing the first structure to the second structure, forming an opening in the first structure that is aligned with a second sensing arrangement of the second structure to expose the first side of the second sensing arrangement to an ambient pressure, and affixing a third structure to a second side of the second structure at a second pressure different from the first pressure to provide a second sealed chamber at the second pressure adjacent to the second side of the first sensing arrangement and the second sensing arrangement in response to affixing the third structure to the second structure. In one embodiment, the method further comprises forming a first diaphragm region for the first sensing arrangement on the second structure, wherein the first side of the first diaphragm region is adjacent to the first sealed chamber when the second structure is affixed to the first structure, forming a second diaphragm region for the second sensing arrangement on the second structure, wherein the opening in the first structure is aligned with the second diaphragm region to expose the first side of the second diaphragm region to the ambient pressure, and forming openings in the second structure to expose the second side of the first diaphragm region and the second side of the second diaphragm region to the second pressure. In another embodiment, the method further comprises forming a third sensing arrangement in the second structure, wherein the third sensing arrangement is at the second pressure when the third structure is affixed to the second structure.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A sensor device comprising:
   a first structure including a first sensing arrangement and a second sensing arrangement formed therein;
   a second structure affixed to the first structure, wherein the second structure includes:
      a cavity aligned with the first sensing arrangement to provide a first reference pressure on a first side of the first sensing arrangement; and
      an opening aligned with the second sensing arrangement to expose the first side of the second sensing arrangement to an ambient pressure; and
   a third structure coupled to a second side of the first structure to provide a sealed chamber adjacent to the second side of the first sensing arrangement and the second side of the second sensing arrangement, the sealed chamber providing a second reference pressure on the second side of the first sensing arrangement and the second reference pressure on the second side of the second sensing arrangement, wherein the first reference pressure and the second reference pressure are different.

2. The sensor device of claim 1, wherein:
   the first sensing arrangement includes a first diaphragm region to deflect in response to a difference between the first reference pressure and the second reference pressure; and
   the second sensing arrangement includes a second diaphragm region to deflect in response to a difference between the ambient pressure and the second reference pressure.

3. The sensor device of claim 1, further comprising a third sensing arrangement formed in the first structure, wherein:
   the third structure provides the sealed chamber adjacent to the second side of the third sensing arrangement.

4. The sensor device of claim 1, further comprising a molding compound encapsulating the third structure.

5. The sensor device of claim 1, further comprising a third sensing arrangement formed in the first structure.

6. The sensor device of claim 5, wherein the third sensing arrangement comprises an inertial sensing arrangement.

7. The sensor device of claim 1, wherein:
   the first sensing arrangement comprises a first pressure sensing arrangement; and
   the second sensing arrangement comprises a second pressure sensing arrangement.

8. The sensor device of claim 7, wherein:
   the first reference pressure is at vacuum; and
   the second reference pressure on the second side of the first sensing arrangement and the second side of the second sensing arrangement is at partial vacuum.

9. The sensor device of claim 1, wherein:
   the first sensing arrangement comprises a first pressure sensing arrangement; and
   the second sensing arrangement comprises a second pressure sensing arrangement.

10. The sensor device of claim 9, the first pressure sensing arrangement including a first diaphragm region and the second pressure sensing arrangement including a second diaphragm region, deflection of the first diaphragm region being influenced by the first reference pressure, wherein deflection of the second diaphragm region is influenced by the ambient pressure and independent of the first reference pressure.

11. The sensor device of claim 10, further comprising control circuitry to determine a pressure metric indicative of the ambient pressure based on a relationship between a first electrical signal from the first sensing arrangement and a second electrical signal from the second sensing arrangement, wherein the first electrical signal is influenced by the deflection of the first diaphragm region and the second electrical signal is influenced by the deflection of the second diaphragm region.

12. The sensor device of claim 1, wherein:
   the first sensing arrangement includes a first diaphragm region;
   the second sensing arrangement includes a second diaphragm region exposed to an ambient pressure;
   the cavity comprises a second sealed chamber adjacent to a first side of the first sensing arrangement, the second sealed chamber having the first reference pressure, wherein first diaphragm region deflects in response to a difference between the first reference pressure and the second reference pressure and the second diaphragm region deflects in response to a difference between the ambient pressure and the second reference pressure.

13. The sensor device of claim 12, further comprising an integrated circuit die having control circuitry formed thereon, the control circuitry being coupled to the sensor device to determine a pressure metric indicative of the ambient pressure based on a relationship between a first electrical signal from the first sensing arrangement and a second electrical signal from the second sensing arrangement, wherein the first electrical signal is influenced by the deflection of the first diaphragm region and the second electrical signal is influenced by the deflection of the second diaphragm region.

14. The sensor device of claim 13, further comprising a package substrate structure having the sensor device and the integrated circuit die affixed thereto, wherein the package substrate structure includes a second opening aligned with the second sensing arrangement to expose the second diaphragm region to the ambient pressure.

15. The sensor device of claim 12, further comprising:
an inertial sensing arrangement; and
a substrate of semiconductor material having the first sensing arrangement, the second sensing arrangement, and the inertial sensing arrangement formed therein, wherein the sealed chamber encompasses a side of the inertial sensing arrangement.

16. A method of fabricating the sensor device of claim 1, the method comprising:
forming the second structure having the cavity;
affixing the second structure to the first side of the first structure at the first reference pressure, the cavity providing a second sealed chamber at the first reference pressure adjacent to the first side of the first sensing arrangement of the first structure in response to affixing the first structure to the second structure;
forming the opening in the second structure, the opening being aligned with the second sensing arrangement of the first structure to expose the first side of the second sensing arrangement to the ambient pressure; and
affixing the third structure to the second side of the first structure at the second reference pressure, the third structure being configured to provide the sealed chamber at the second reference pressure adjacent to the second side of the first sensing arrangement and the second sensing arrangement in response to affixing the third structure to the first structure.

17. The method of claim 16, further comprising:
forming a first diaphragm region for the first sensing arrangement on the first structure, the first side of the first diaphragm region being adjacent to the second sealed chamber when the second structure is affixed to the first structure;
forming a second diaphragm region for the second sensing arrangement on the first structure, the opening in the second structure being aligned with the second diaphragm region to expose the first side of the second diaphragm region to the ambient pressure; and
forming openings in the first structure to expose the second side of the first diaphragm region and the second side of the second diaphragm region to the second reference pressure.

18. The method of claim 17, further comprising forming a third sensing arrangement in the first structure, wherein the third sensing arrangement is at the second reference pressure when the third structure is affixed to the first structure.

* * * * *